United States Patent
Solin et al.

[11] Patent Number: 6,048,632
[45] Date of Patent: Apr. 11, 2000

[54] SELF-BIASING, NON-MAGNETIC, GIANT MAGNETORESISTANCE SENSOR

[75] Inventors: Stuart A. Solin, Princeton Junction; Tineke Thio, Princeton, both of N.J.; Masaya Kawano, Tokyo, Japan

[73] Assignees: NEC Research Institute, Princeton, N.J.; NEC Corporation, Tokyo, Japan

[21] Appl. No.: 08/917,058

[22] Filed: Aug. 22, 1997

[51] Int. Cl.[7] ....................................................... G11B 5/66
[52] U.S. Cl. ................. 428/692; 428/694 R; 428/694 T; 428/900; 360/113; 360/125; 360/126; 338/32 R; 324/252
[58] Field of Search ................................. 428/692, 694 R, 428/694 T, 900; 360/113, 125, 126; 338/32 R; 324/252

[56] References Cited

U.S. PATENT DOCUMENTS

| | | | |
|---|---|---|---|
| 5,622,874 | 4/1997 | Seidler | 438/3 |
| 5,696,655 | 12/1997 | Kawano | 360/113 |
| 5,699,215 | 12/1997 | Solin | 360/113 |

OTHER PUBLICATIONS

S.A. Solin et al, "Self–biasing nonmagnetic giant magnetoresistance sensor", Applied Physics Letters 69, (26), Dec. 23, 1996, pp. 4105–4107.

*Primary Examiner*—Leszek Kiliman
*Attorney, Agent, or Firm*—Jeffrey J. Brosemer; Philip J. Feig

[57] ABSTRACT

A self-biasing, non-magnetic giant magnetoresistive sensor having a Corbino-disk geometry constructed from a thin film of e.g., doped, Mercury Cadmium Telluride (MCT) $Hg_{1-x}Cd_xTe$ exhibiting anomalously large Giant Magnetresistance (GMR) and zero field offset. In one embodiment, the sensor has a silicon substrate, a layer of doped, inhomogeneous MCT, and electrodes attached to the inhomogeneous layer. Alternatively, a buffer layer of, e.g., CdTe may overlay the substrate. In another embodiment, the sensor has a silicon substrate, a layer of doped, homogeneous MCT, and electrodes attached to the doped homogeneous MCT. Alternatively, a buffer layer of, e.g., CdTe may overlay the substrate as well. With constructed in as either of these embodiments, highly doped Corbino devices may show a significant zero-field offset in the GMR which results in a built-in bias field as high as 1500 G at T=300 K.

32 Claims, 4 Drawing Sheets

SELF-BIASING, NON-MAGNETIC, GIANT MAGNETORESISTANCE SENSOR

FIELD OF THE INVENTION

The present invention relates generally to sensors for reading information signals recorded in a magnetic medium and, more particularly, to a self-biasing, non-magnetic giant magnetoresistance (GMR) sensor constructed from doped Mercury Cadmium Telluride (MCT), $Hg_{1-x}Cd_xTe$.

BACKGROUND OF THE INVENTION

Various types of sensors exhibiting magnetoresistive characteristics are known and implemented in systems for the reading of information signals recorded in a magnetic medium such as tapes, drums and diskettes. These sensors typically comprise a block made of a ferromagnetic alloy exhibiting high magnetoresistance. A recording medium passing in close proximity to such a sensor causes variations in the magnetic field at the position of the read head, and hence variations of the electrical resistance of the magnetoresistive sensor. The alloys most frequently used are nickel-based ferromagnetic alloys such as NiCo or NiFe (Permalloy) which have high magnetoresistance but which, at ambient temperatures, give a relative variation in resistance of only a few percent at the relevant (average) magnetic fields (~50 G) accessible to those particular sensors.

Recently however, magnetoresistive sensors have been described exhibiting a form of magnetoresistance generally known as "spin-valve" (SV) magnetoresistance, in which the change in resistance of the sensor is attributed to the spin-dependent transmission of conduction electrons between the magnetic layers of the sensor and the accompanying spin-dependent scattering at the layer interfaces. In such a sensor, the magnetoresistance is observed to vary as the cosine of the angle between the magnetizations of the layers and is dependent of the direction of current flow through the sensor. Yet while such sensors do exhibit a magnetoresistance that, for selected combinations of materials, is greater in magnitude than that exhibited by the alloy magnetoresistors (AMR), they too suffer from having a relatively small variation in magnetoresistance at ambient temperatures.

More recently, magnetoresistive sensors for reading/writing information signals stored on a magnetic medium and constructed from undoped MCT have been described in copending applications Ser. No. 08/396,819 filed on Mar. 2, 1995, now U.S. Pat. No. 5,646,051 and Ser. No. 08/435,254 filed on May 5, 1995, now U.S. Pat. No. 5,646,051, each assigned to the same assignee as the instant application and incorporated herein by reference. Such sensors offer the advantage of a pronounced magnetoresistance Importantly, magnetoresistive sensors are normally fabricated with a thin overlayer of hard magnetic material to provide a bias field required for optimum performance. The bias field can serve a number of purposes including: a) pre-aligning the spins in a polycrystalline sensor such as permalloy, b) shifting the operation of the detector to a region in which the field dependence of the resistance, R(H), is increased relative to that at H=0, c) shifting to a region of increased linearity and/or d) in the case of detectors with a symmetric response where R(H)=R(-H), providing the necessary asymmetry to sense the field direction.

As shown in some of the prior art for magnetoresistive sensors incorporating MCT as the magnetoresistive element, a bias field is required to introduce an asymmetry in the field response. Therefore, the fabrication, design and construction of an MCT field sensor could be greatly simplified if the material was self-biasing, especially if the self-biasing field could be controlled in the fabrication process. One such example of a self-biasing nonmagnetic giant magnetoresistance sensor was described in an article by S. A. Solin, T. Thio, J. W. Bennett, D. R. Hines, M. Kawano, N. Oda and M. Sano, entitled "Self-biasing Nonmagnetic Giant Magnetoresistance Sensor" that appeared in Applied Physics Letters, Vol. 69, Dec. 23, 1996. There, the authors describe room temperature giant magnetoresistance exhibiting a zero-field offset of as much as 350 G at room temperature. The resultant asymmetry in the field dependence of the GMR constitutes a self-biasing effect. Given this promising approach for developing sensors and its potential applicability to computer storage devices, additional improvements in the magnetoresistive material itself is desirable. Consequently a continuing need exists in the art for improved magnetoresistive materials and methods for fabricating such self-biasing, nonmagnetic giant magnetoresistance sensors.

SUMMARY OF THE INVENTION

The present invention is a self-biasing, non-magnetic giant magnetoresistive sensor exhibiting a large zero field offset, constructed from a thin film of doped magnetoresistive material, specifically, Mercury Cadmium Telluride. The thin film may be advantageously grown using a variety of techniques such as Molecular Beam Epitaxy (MBE) or Chemical Vapor Deposition (CVD).

Viewed from one aspect, the present invention is directed to such a self-biasing, non-magnetic magnetoresistive sensor having a silicon substrate or an alternative material, i.e., GaAs, oxides, SrTiO, a buffer layer of undoped CdTe or other lattice-matched compound overlying the substrate, a doped, inhomogeneous magnetoresistive layer, i.e., $Hg_{1-x}Cd_xTe$, and electrodes attached to the magnetoresistive layer.

Viewed from another aspect, the present invention is directed to a self-biasing, non-magnetic magnetoresistive sensor having a silicon substrate, a buffer layer of undoped CdTe or other lattice-matched compound overlying the substrate, and a doped, homogeneous magnetoresistive layer of MCT with electrodes attached to the magnetoresistive layer.

Finally, the present invention may be viewed from yet another aspect, that is a read/write head containing a self-biasing, non-magnetic magnetoresistive sensor having a Corbino structure, particularly well suited for reading information signals stored in a magnetic medium with high storage density such as is found in present day computer memory systems.

DETAILED DESCRIPTION

A detailed description of the invention will now be presented while referring to the figures, several of which may be simultaneously referred to during the course of the following description.

Figure 1A:
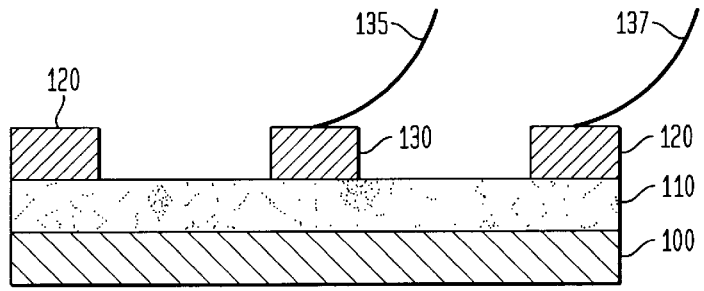
FIG. 1(a) is a cross-sectional view of a magnetoresistive sensor of the present invention.
Figure 1B:
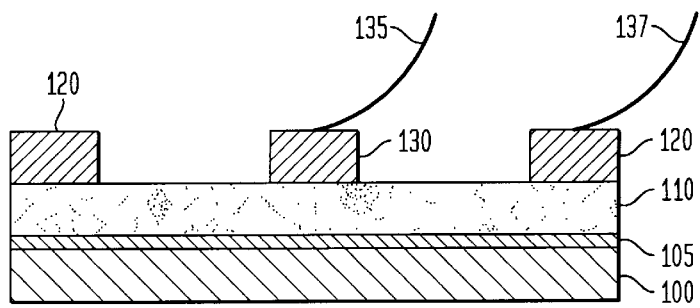
FIG. 1(b) is a cross-sectional view of an alternative embodiment of the magnetoresistive sensor of FIG. 1(a) wherein a buffer layer is interposed between MCT layer and substrate layer.

FIGS. 1(a) and 1(b) show a Corbino disc-type magnetoresistive sensor of the present invention. In one embodiment, non-homogeneous magnetoresistive layer 110 was deposited upon a semiconductor substrate 100. Preferably, the non-homogeneous layer may be made of doped, Mercury Cadmium Telluride, $Hg_{1-x}Cd_xTe$, where x varies throughout the material thereby imparting the non-homogeneous characteristic.

Importantly, while this description pertains to an embodiment utilizing doped, inhomogeneous MCT, it is to be understood by those skilled in the art that doped, homogeneous magnetoresistive MCT may be used as well.

Specifically, the dopants used with the MCT may be either n-type or p-type. In particular, the n-type dopants used within the MCT may be from Group III (Al, Ga, In, and Tl); Group IV (Si, Ge, Sn, and Pb); or Group VII (F, Cl, Br, I, and At). Alternatively, the p-type dopants used within the MCT may be Group Ia (Li, Na, K, Rb, Cs, and Fr); Group Ib (Cu, Ag, and Au); or Group V (N, P, As, Sb, and Bi).

Continuing with the discussion of one particular embodiment, conductive electrodes 120, 130 are applied to the magnetoresistive layer by standard photolithographic techniques. Leads, 135, 137 may then be attached to the electrodes by any of a variety of conductive means, e.g., conductive epoxy cement or gold/bonding wire. Advantageously, and as shown in FIG. 1(b), buffer layer 105 may be applied between the substrate and the magnetoresistive layer. The buffer layer may be made of any material compatible with the substrate and the magnetoresistive layer, e.g., Cadmium Telluride. Once again, while the discussion has been directed to inhomogeneous, doped Mercury Cadmium Telluride, $Hg_{1-x}Cd_xTe$, those skilled in the art will quickly recognize that doped, homogeneous MCT may be used as well.

For either the inhomogeneous or homogeneous embodiment, representative MCT films may be grown on single crystal Si substrates by conventional molecular-beam epitaxy (MBE) techniques using methods well known in the art. In this particular embodiment, a ~4 $\mu$m buffer layer of undoped CdTe separates the substrate and the 4.6 $\mu$m thick $Hg_{1-x}Cd_xTe$ layer in the sensor depicted by FIG. 1(b).

Figure 1C:
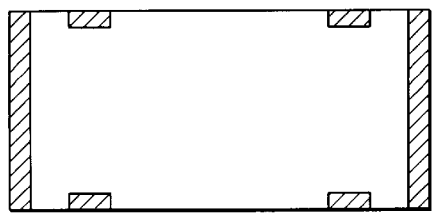
FIGS. 1(c) and 1(d) are plan views of alternative embodiments of a magnetoresistive sensor of the present invention, namely a Hall Bar and Corbino Disc, respectively.
Figure 1D:
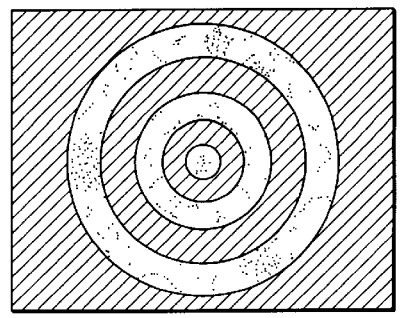

FIGS. 1(c) and 1(d) show plan views of magnetoresistive sensors (Hall bar and Corbino disc) which have been constructed according to the present invention.

Figure 3:
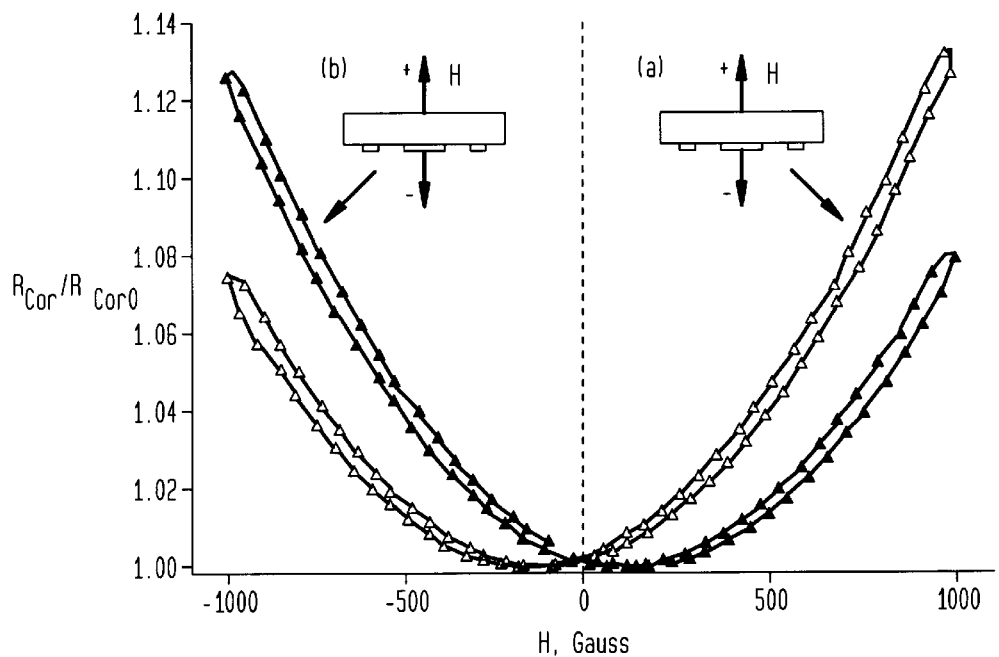
FIG. 3 shows the magnetoresistance of a Corbino disc sensor constructed according to the teachings of the present invention, having (a) normal orientation relative to the applied field (open triangles) and (b) inverted orientation (solid triangles) at T=300° K.

In FIG. 3 there is shown the room temperature low-field (H<0.1 T) GMR measured in the Corbino disc geometry. As expected, the GMR, defined hereafter as $R_{Cor}(H)/R_{Cor}(0)$ where $R_{Cor}(H)$, is quadratic in field. However, contrary to expectation, the GMR is not symmetric in the applied field about H=0. For the measurement configuration shown in the right panel inset of FIG. 3, there is a zero-field offset, $H_0$~−145 Gauss of the minimum in the GMR while for the "inverted" configuration shown in the left panel inset $H_0$ is of the same magnitude but opposite sign. This offset is much larger than the remanent magnetic field in the superconducting magnet (~20 G). More significantly, because the offset changes sign when the sample is inverted in the magnetic field, it cannot be attributed to a remanent field but rather is an effect intrinsic to the sample. The zero-field offset, $H_0$, constitutes a self-biasing of the Corbino device. We now describe additional measurements of the magnetotransport properties.

Figure 4:
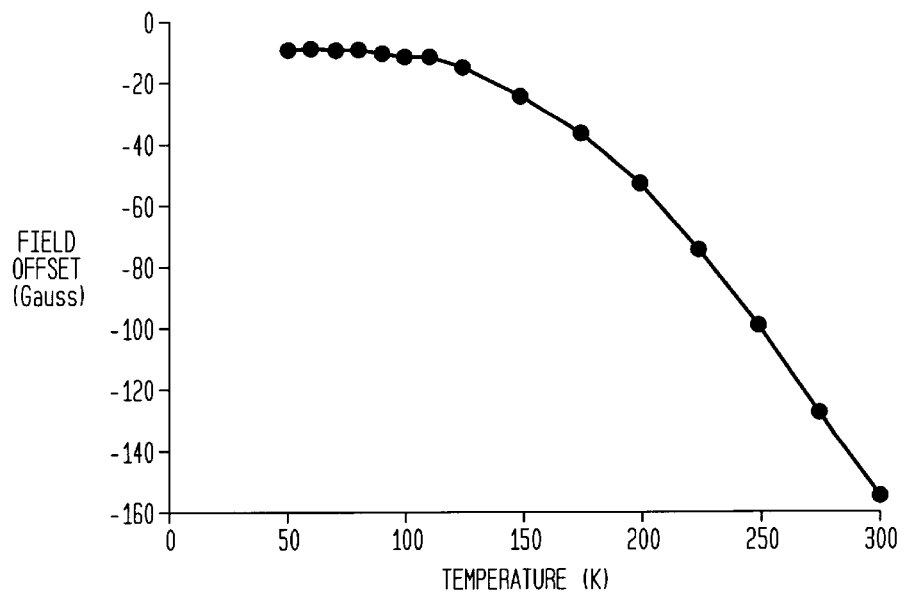
FIG. 4 shows the temperature dependence of magnetic field offset $H_0$ in the Corbino disc magnetoresistance.

In order to gain insight into this zero-field offset, the low-field GMR was measured as a function of temperature, and fitted at each temperature to a parabolic dependence on the magnetic field. The position of the minimum, $H_0$, is plotted in FIG. 4 as a function of temperature. The offset is largest at high temperature, and decreases to a value of order the remanent field at low temperature. For the Corbino discs measured, the temperature dependence of $H_0$ is similar, but the magnitude at room temperature varies between 100 and 350 G.

In accordance with the teachings of the present invention, doped MCT, specifically $Hg_{1-x}Cd_xTe$:In of thickness 4–5 $\mu$m was grown epitaxially onto a buffer layer of undoped CdTe on a Si substrate. The samples were undoped and unannealed. An example of a sample composition having x=0.060±0.015, was determined using energy dispersive x-ray analysis with HgTe and CdTe standards. The samples were placed, on a temperature-controlled sample holder, in the centre of an superconducting magnet; lithographically defined Indium contacts were deposited in a 6-probe Hallbar geometry to allow the simultaneous measurement of the GMR and the Hall effect, as well as a 4-probe Corbino geometry with concentric current and voltage contacts.

Figure 5:
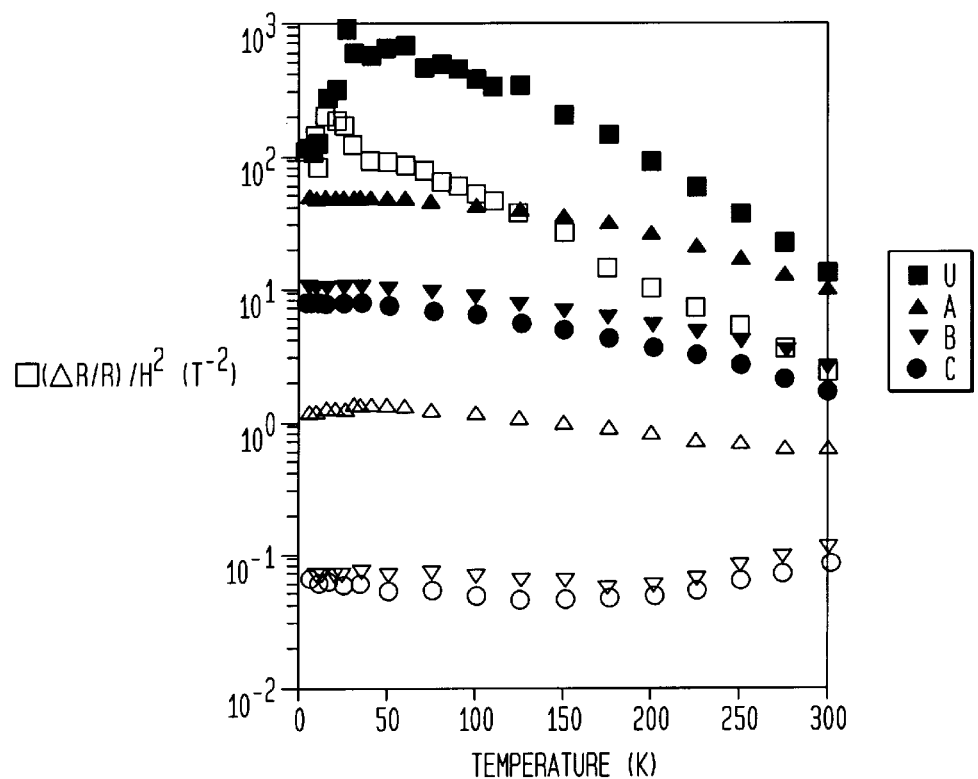
FIG. 5 is a graph showing the curvature (solid symbols) of the Hallbar GMR and square of the electron mobility (open symbols) for various samples.

The Hall effect measurements give doping densities as follows: $N_D=1.6\times10^{17}$ cm$^{-3}$ in sample A, $N_D=1.2\times10^{18}$ cm$^{-3}$ in sample B, and $N_D=1.7\times10^{18}$ cm$^{-3}$ in sample C. At low magnetic field H, the GMR is quadratic, $R(H)=R_O+CH^2$. The curvature $C=\Delta R/R_OH^2$, measured in a Hallbar-geometry, is plotted in FIG. 5, along with the square of the electron mobility, $\mu_e(T)$. For comparison, a nominally undoped sample (sample U) with x=0.10 and an acceptor density $N_A=2.5\times10^{16}$ cm$^{-3}$, is included in the FIG. At low temperature, $\mu_e$ saturates to a value which follows $\mu_e(0) \sim N_D^{-\frac{1}{2}}$, consistent with the results from reported by others, namely Dubowski et al in an article that appeared in J. Phys. Chem. Sol. Vol. 42, pp. 351, 1981. At high temperature electron-phonon scattering is apparent in the temperature dependence of the mobility; it is most important in the nominally undoped material which has the lowest impurity density.

In the undoped compound (U), the GMR follows $C=T_M\mu_e^2$, with $T_M$~0.1. In the doped samples this relation does not hold over the entire temperature range, and at low temperature, where both $\mu_e(T)$ and the GMR saturate, $T_M$<<1, suggesting that for these compositions carrier scattering is not the dominant mechanism for the GMR.

However, even though the Hallbar data suggest that the doped materials are inferior to the undoped ones for applications requiring GMR, a surprise is contained in the results from the Corbino geometry samples. In the latter, the GMR is related to that measured in a Hallbar by $R_C(H)/R_C(0)=$ $(1+\mu^2H^2)R_{HB}(H)/R_{HB}(0)$. This implies that the difference in the curvatures of the GMR measured in the two geometries is expected to be $C_C - C_{HB} = \mu^2$.

Figure 6:
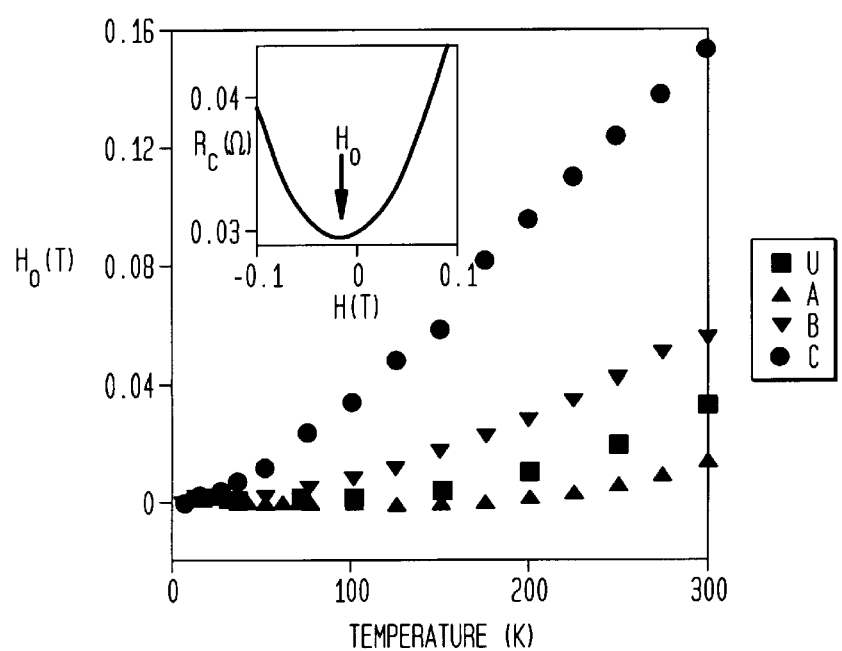
FIG. 6 is a graph showing the zero field offset in the Corbino geometry of sample C of FIG. 5 with inset graph showing the Corbino GMR for Sample A of FIG. 6 at T=300 K.

For the undoped material, $C_C - C_{HB}$ indeed follows $\mu^2$ over the entire temperature range of the experiment (without adjustable parameters). For the doped compounds, this is also the case at low temperatures. However, at higher temperatures there is a significant deviation from the $\mu^2$ behaviour, with the Corbino curvature being larger than that expected from the mobility by a factor ~4. Such an enhancement is very useful in applications, but we do not at present understand the origin of this discrepancy. We can, however, rule out several possibilities: One artifact which can certainly be excluded is the presence of gross inhomogeneities in the sample composition through the wafers on the scale of a few mm, the size of the samples: Results on the carrier density and mobility from Hallbar samples from six different wafers are quantitatively entirely consistent (to within 10%) with one another; it would be extremely fortuitous to obtain such consistency from wafers which are internally inhomogeneous. Another possibility is inhomogeneity on the microscopic scale. There is in fact evidence for such microscopic inhomogeneity from the GMR in the Corbino samples: the resistance is symmetric not around H=0 but around a finite field $H_0$ (see FIG. 3 and inset of FIG. 6). Such a zero-field offset has been shown to arise from a Hall contribution to the GMR due to inhomogeneities on the microscopic scale. However, we have found that the most lightly doped compound (A) exhibits the largest discrepancy between the $C_C - C_{HB}$ and $\mu^e$, whereas from FIG. 6 it is clear that it is a most heavily doped material (C) which has the highest zero-field offset. The latter result suggests that the microscopic inhomogeneities increase with doping density, perhaps due to a separation into dopant-rich and dopant-poor phases.

The zero-field offset is has important technological implications, since it constitutes a built-in bias field, without which a magnetoresistive read-head device does not distinguish between up and down magnetic fields which represents the data bits in magnetic media. It is desirable to have a high offset as well as a large GMR curvature at room temperature: $C \sim 100$ $T^{-1}$ gives $\Delta R/R \sim 1$ at H=1000 G, the fields relevant for magnetic media.

Figure 2A:
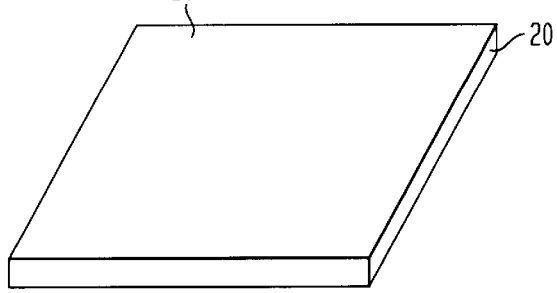
FIGS. 2A–2G illustrate, in perspective, a read/write head sensor being fabricated in various stages of its preparation in accordance with an illustrative embodiment of the invention.
Figure 2B:
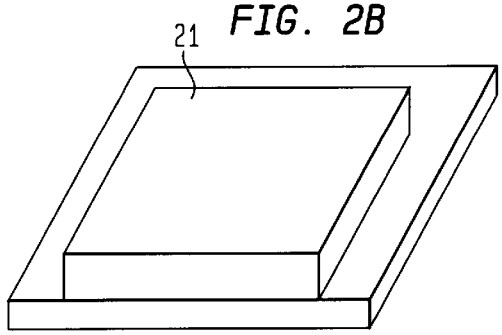

In accordance with one embodiment of the present invention, a sensor is prepared as follows. First, there is prepared a suitable substrate 20, as shown in FIG. 2A, advantageously of a semiconductor such as silicon, gallium arsenide or other material upon which there can be grown subsequent layers. A top surface 20A of the substrate may be doped or coated to be sufficiently conductive to serve well as one terminal of the sensor. There is then deposited over the substrate surface, a first layer 21, which may advantageously be the same semiconductive material as the substrate, though essentially undoped. Advantageously, and as shown in FIG. 2B, this layer is deposited to be essentially monocrystalline. As shown in FIG. 2B, layer 21 is patterned to be narrower and shorter than the substrate. The patterning may be performed through the use of techniques well-known in the microelectronics industry such as photolithography and etching.

Figure 2C:
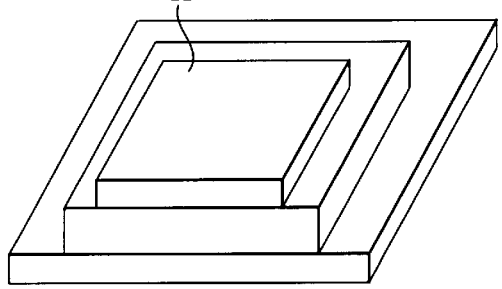

Next, and as shown in FIG. 2C, there is deposited a second layer 22 which is narrower and shorter than the first layer 21. This second layer 22 is a material having desirable magnetoresistive properties, such as zero-gap mercury cadmium telluride or mercury zinc telluride. Advantageously, this layer may be grown as a highly crystalline layer.

Figure 2D:
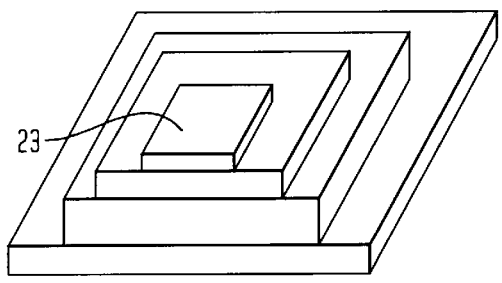

As shown in FIG. 2D, there is next deposited a third layer 23 of a conductive material, such as a molybdenum-gold alloy that will make good ohmic connection to the second layer. This third layer is deposited and patterned to be narrower than the second layer 22.

Figure 2E:
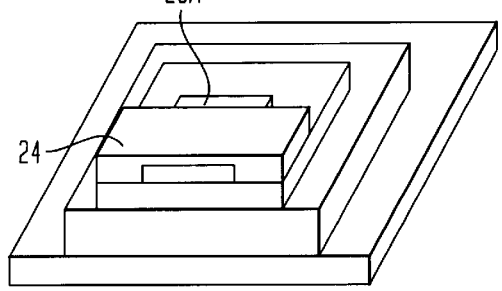

Next, and as shown in FIG. 2E, a fourth layer 24 of magnetoresistive material is deposited to bridge the metallic layer 23 and form a continuous loop of magnetoresistive material around the conductive third layer 23. This fourth layer, while made from the same general magnetoresistive material as the second layer 22, has sufficient compositional variation from the second layer material such that a continuous loop of magnetoresistive material surrounds the conductive layer. As an example of an inhomogeneous embodiment, if the second layer 22 were made from MCT having the general formula $Hg_{1-x}Cd_xTe$ where x~0.1, then the fourth layer may be made from MCT having the general formula $Hg_{1-x}Cd_xTe$ where x varies throughout the fourth layer or where $x_{second\ layer} \neq x_{fourth\ layer}$. This fourth layer is patterned, as shown, so that the metallic layer is centered within the loop but there is left exposed an end portion 23A of the conductive layer 23 to which a terminal connection may subsequently be made.

Figure 2F:
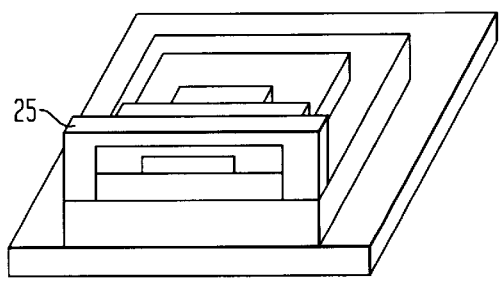
Figure 2G:
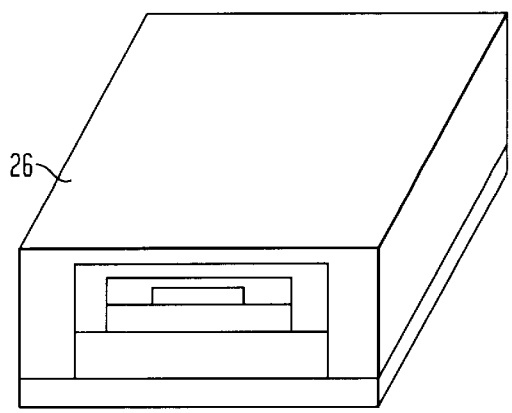

Next, as shown in FIG. 2F, there is deposited a fifth layer 25, advantageously of the same material as the first layer 21, and is patterned to form a bridge over the fourth layer 24 and a continuous loop that surrounds the fourth layer 24. Advantageously there is left uncovered the portion 23A of the conductive layer 23 until a terminal connection has been made to the uncovered portion.

The basic elements of the magnetoresistive sensor are now essentially in place. There remains the need to diffuse an impurity into the exposed front face of the stack to dope the exposed front edge of the loop of undoped semiconductor formed of the first and fifth layers (21,25) to a conductive state so that the doped loop can serve as the conductive outer electrode of the Corbino structure.

Clearly, it should now be quite evident to those skilled in the art, that while the invention was shown and described in detail in the context of a preferred embodiment, and with various modifications thereto, a wide variety of other modifications can be made without departing from the scope of the inventive teachings which should only be limited by the following claims.

What is claimed is:

1. A sensor having a magnetoresistive effect for sensing magnetic patterns, stored as a series of magnetic domains in a storage device, said sensor comprising:

a substrate;

a layer of inhomogeneous doped magnetoresistive material, overlying said substrate wherein said magnetoresistive material is sufficiently doped to produce a large zero-field-offset of as much as 1500 G at room temperature within said material; and a plurality of electrodes, attached to said layer of magnetoresistive material.

2. The magnetoresistive sensor according to claim 1 wherein said layer of magnetoresistive material is doped with an n-type dopant.

3. The magnetoresistive sensor according to claim 2 wherein said n-type dopant within the layer of magnetoresistive material is a Group III element selected from the group consisting of B, Al, Ga, In and Tl.

4. The magnetoresistive sensor according to claim 2 wherein said n-type dopant within the layer of magnetoresistive material is a Group IV element selected from the group consisting of Si, Ge, Sn and Pb.

5. The magnetoresistive sensor according to claim 2 wherein said n-type dopant within the layer of magnetoresistive material is a Group VII element selected from the group consisting of F, Cl, Br, I, and At.

6. The magnetoresistive sensor according to claim 1 wherein said layer of magnetoresistive material is doped with a p-type dopant.

7. The magnetoresistive sensor according to claim 6 wherein said p-type dopant is a Group Ia element selected from the group consisting of Na, K, Rb, Cs, and Fr.

8. The magnetoresistive sensor according to claim 6 wherein said p-type dopant is a Group Ib material selected from the group consisting of Cu, Ag and Au.

9. The magnetoresistive sensor according to claim 6 wherein said p-type dopant is a Group V element selected from the group consisting of N, P, As, Sb and Bi.

10. The magnetoresistive sensor according to claim 1 further comprising a buffer layer interposed between said substrate and said magnetoresistive layer.

11. The magnetoresistive sensor according to claim 10 wherein said buffer layer is substantially Cadmium Telluride.

12. A sensor with a magnetoresistive effect for sensing magnetic patterns, stored as a series of magnetic domains in a storage device, said sensor comprising:

a substrate;

an inhomogeneous layer of magnetoresistive material consisting substantially of doped Mercury Cadmium Telluride, $Hg_{1-x}Cd_xTe$, overlying said substrate, wherein said Mercury Cadmium Telluride is sufficiently doped to produce a large zero-field-offset of as high as 1500 G at room temperature within said material; and a plurality of electrodes, attached to said inhomogeneous layer of magnetoresistive material.

13. The magnetoresistive sensor according to claim 12 wherein said inhomogeneous layer of Mercury Cadmium Telluride is doped with an n-type dopant.

14. The magnetoresistive sensor according to claim 13 wherein said n-type dopant within the inhomogeneous layer of Mercury Cadmium Telluride is a Group III element selected from the group consisting of B, Al, Ga, In and Tl.

15. The magnetoresistive sensor according to claim 13 wherein said n-type dopant within the inhomogeneous layer of Mercury Cadmium Telluride is a Group IV element selected from the group consisting of Si, Ge, Sn and Pb.

16. The magnetoresistive sensor according to claim 13 wherein said n-type dopant within the inhomogeneous layer of Mercury Cadmium Telluride is a Group VII element selected from the group consisting of F, Cl, Br, I, and At.

17. The magnetoresistive sensor according to claim 12 wherein said inhomogeneous layer of Mercury Cadmium Telluride is doped with a p-type dopant.

18. The magnetoresistive sensor according to claim 17 wherein said p-type dopant is a Group Ia element selected from the group consisting of Na, K, Rb, Cs, and Fr.

19. The magnetoresistive sensor according to claim 17 wherein said p-type dopant is a Group Ib material selected from the group consisting of Cu, Ag and Au.

20. The magnetoresistive sensor according to claim 17 wherein said p-type dopant is a Group V element selected from the group consisting of N, P, As, Sb and Bi.

21. The magnetoresistive sensor according to claim 12 further comprising a buffer layer interposed between said substrate and said inhomogeneous magnetoresistive layer.

22. The magnetoresistive sensor according to claim 21 wherein said buffer layer is substantially Cadmium Telluride.

23. A magnetoresistive sensor for sensing magnetic patterns stored as a series of magnetic domains in a storage device comprising:

an inhomogeneous semiconductive wafer of magnetoresistive material consisting substantially of doped Mercury Cadmium Telluride having at least one planar surface, wherein said Mercury Cadmium Telluride is sufficiently doped to produce a large zero-field-offset of as high as 1500 G at room temperature within said material;

electrode means including an inner electrode and an outer electrode surrounding the inner electrode on the planar surface of the inhomogeneous semiconductive material; and means for supporting the planar surface of the inhomogeneous semiconductive wafer of magnetoresistive material adjacent to the magnetic patterns stored on the storage device.

24. The magnetoresistive sensor according to claim 23 further comprising:

buffer means positioned between said supporting means and said inhomogeneous semiconductor wafer.

25. The magnetoresistive sensor according to claim 23 wherein said inhomogeneous layer of Mercury Cadmium Telluride is doped with an n-type dopant.

26. The magnetoresistive sensor according to claim 25 wherein said n-type dopant within the inhomogeneous layer of Mercury Cadmium Telluride is a Group III element selected from the group consisting of B, Al, Ga, In and Tl.

27. The magnetoresistive sensor according to claim 25 wherein said n-type dopant within the inhomogeneous layer of Mercury Cadmium Telluride is a Group IV element selected from the group consisting of Si, Ge, Sn and Pb.

28. The magnetoresistive sensor according to claim 25 wherein said n-type dopant within the inhomogeneous layer of Mercury Cadmium Telluride is a Group VII element selected from the group consisting of F, Cl, Br, I, and At.

29. The magnetoresistive sensor according to claim 23 wherein said inhomogeneous layer of Mercury Cadmium Telluride is doped with a p-type dopant.

30. The magnetoresistive sensor according to claim 29 wherein said p-type dopant is a Group Ia element selected from the group consisting of Na, K, Rb, Cs, and Fr.

31. The magnetoresistive sensor according to claim 29 wherein said p-type dopant is a Group Ib material selected from the group consisting of Cu, Ag and Au.

32. The magnetoresistive sensor according to claim 29 wherein said p-type dopant is a Group V element selected from the group consisting of N, P, As, Sb and Bi.

* * * * *